United States Patent [19]

Edwards

[11] Patent Number: 4,885,627
[45] Date of Patent: Dec. 5, 1989

[54] METHOD AND STRUCTURE FOR REDUCING RESISTANCE IN INTEGRATED CIRCUITS

[75] Inventor: Nathen P. Edwards, Darien, Conn.

[73] Assignee: International Business Machines Corporation, Armonk, N.Y.

[21] Appl. No.: 259,473

[22] Filed: Oct. 18, 1988

Related U.S. Application Data

[63] Continuation of Ser. No. 854,283, Apr. 21, 1986, abandoned.

[51] Int. Cl.[4] ............... H01L 29/04; H01L 29/78; H01L 23/48
[52] U.S. Cl. ............... 357/59; 357/23.4; 357/63; 357/71
[58] Field of Search ........... 357/59 K, 59 E, 59 G, 357/59 J, 59 R, 67, 71, 23.4, 71 P, 23.1, 63

[56] References Cited

U.S. PATENT DOCUMENTS

| | | | |
|---|---|---|---|
| 3,964,092 | 6/1976 | Wadham | 357/68 |
| 3,986,903 | 10/1976 | Watrous, Jr. | 148/187 |
| 4,072,545 | 2/1978 | De La Moneda | 357/59 K |
| 4,193,080 | 3/1980 | Koike et al. | 357/23 |
| 4,280,855 | 7/1981 | Bertin et al. | 357/91 |
| 4,405,935 | 9/1983 | Baji et al. | 357/31 |
| 4,503,448 | 3/1985 | Miyasaka | 357/23.13 |
| 4,613,886 | 9/1986 | Chwang | 357/59 K |

FOREIGN PATENT DOCUMENTS

| | | | |
|---|---|---|---|
| 52-22480 | 2/1977 | Japan | 357/23.4 |
| 54-58373 | 5/1979 | Japan | 357/23.4 |
| 54-68175 | 6/1979 | Japan | 357/23.4 |
| 55-63858 | 5/1980 | Japan | 357/59 R |
| 56-26471 | 3/1981 | Japan | 357/23.4 |
| 2045525 | 3/1980 | United Kingdom | |

OTHER PUBLICATIONS

Grove, "Physics and Technology of Semiconductor Devices", pp. 78 to 83, Solid-State Diffusion, 1967.

Primary Examiner—Andrew J. James
Assistant Examiner—Ngan Van Ngo
Attorney, Agent, or Firm—John J. Goodwin

[57] ABSTRACT

A buried contact structure to decrease the spreading resistance of various circuit elements of semiconductor devices such as transistors and for reducing the resistance of polysilicon wires typically used in short lengths to connect the circuit elements to other metallic wires. The buried contact structure more specifically includes a phosphorous diffusion superimposed on the field implant which includes the source and/or drain of the transistor device. An overlayed layer of polysilicon is then disposed to make contact with the buried contact diffusion. The field implant used for the source and drain may, for example, be boron. The buried contact structure has a lower resistance than the field implant and therefore provides a lower resistance path for the device current.

5 Claims, 3 Drawing Sheets

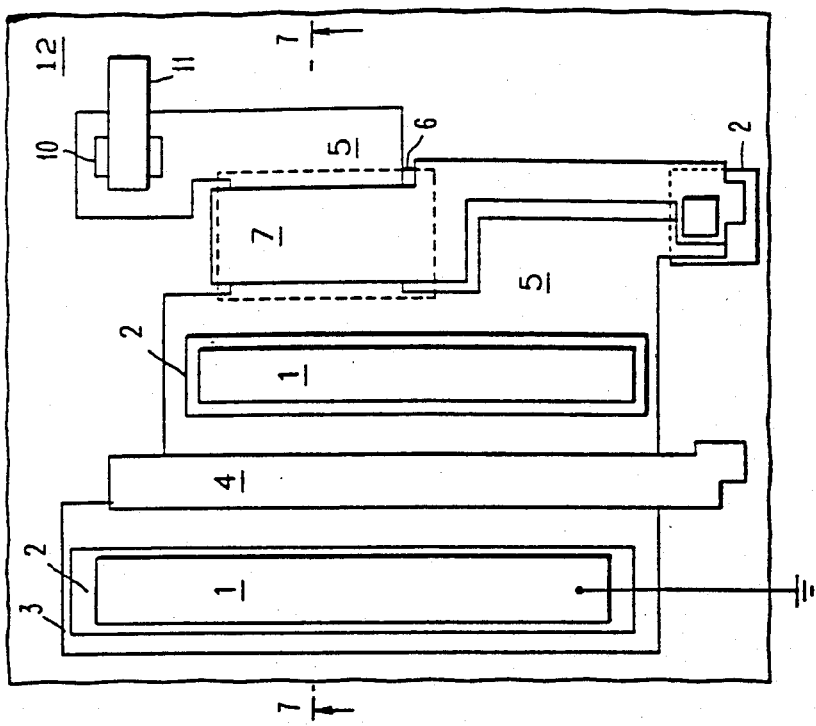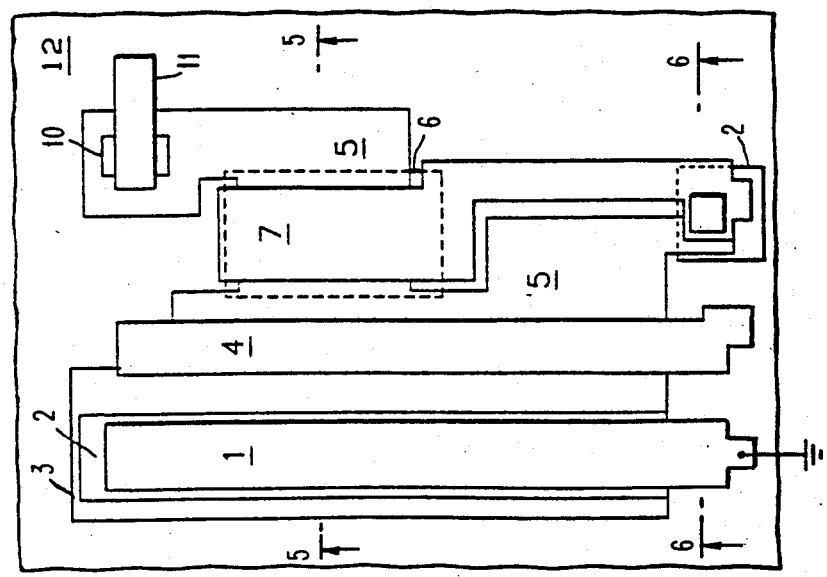

METHOD AND STRUCTURE FOR REDUCING RESISTANCE IN INTEGRATED CIRCUITS

This application is a continuation of application Ser. No. 06/854,283, filed Apr. 21, 1986 now abandoned.

BACKGROUND OF THE INVENTION

1. Field of the Invention

The present invention relates to large scale and very large scale integrated (LSI/VLSI) circuits, and more particularly to techniques and structures for reducing the resistance of the elements of LSI/VLSI circuits for high speed, high power applications.

2. Description of the Prior Art

No prior art directly specific to the use of buried contacts to reducing the spreading resistance of LSI/VLSI elements can be cited. Background art related to the general technology is as follows:

U.S. Pat. No. 3,964,092 issued June 15, 1976 to Wadham, entitled SEMICONDUCTOR DEVICES WITH CONDUCTIVE LAYER STRUCTURE describes a semiconductor device, for example an integrated circuit comprising insulated gate field effect transistors in which the gate electrodes comprise doped portions of a deposited layer of polycrystalline silicon, wherein a first conductive connection layer extends at least partly on insulating material present on one surface of a semiconductor body, the first layer being insulated from and crossing over an underlying, second conductive connection layer which is of semiconductor material locally deposited on the one surface of the semiconductor body, the second layer and the underlying portion of the semiconductor body comprising a quantity of doping substance introduced via said second layer for example in the case of a silicon gate circuit introduced at the same time as simultaneously doping the gate electrodes and forming the source and drain regions.

U.S. Pat. No. 3,986,903 issued Oct. 19, 1976 to Watrous, Jr., entitled MOSFET TRANSISTOR AND METHOD OF FABRICATION, describes an n channel MOSFET transistor which includes doping of previously formed source and drain elements with a heavy diffusion of phosphorous or arsenic creating n++ regions in the source and drain. The extra diffusion step is preferably accomplished just prior to contact metallization.

U.S. Pat. No. 4,193,080 issued Mar. 11, 1980 to Koike et al, entitled NON-VOLATILE MEMORY DEVICE describes a memory device of MNOS FET type wherein a high concentration part and a low concentration part contact each other in the source region and the drain region, and further, double layered insulation films under the gate electrode extending across the source region and drain region are made to contact only the lower concentration part, so that an acceptor impurity is prevented from mixing into the double layered insulation films from the source region and drain region, thus greatly improving the life of the device.

U.S. Pat. No. 4,405,935 issued Sept. 20, 1983 to Baji et al, entitled SOLID-STATE IMAGING DEVICE, discloses a solid-state imaging device having a semiconductor integrated circuit in which a plurality of switching elements for selecting positions of picture elements and scanners for turning "on" and "off" the switching elements in time sequence are disposed on an identical substrate, a photoconductive film which is disposed on the integrated circuit and which is connected to one end of each of the switching elements, and a light transmitting electrode which is disposed on the photoconductive film.

U.S. Pat. No. 4,503,448 issued Mar. 5, 1985 to Miyasaka, entitled SEMICONDUCTOR INTEGRATED CIRCUIT DEVICE WITH A HIGH TOLERANCE AGAINST ABNORMALLY HIGH INPUT VOLTAGE, describes a semiconductor integrated device with a high tolerance against abnormally high input voltages which comprises a first MIS transistor at the input stage and a second MIS transistor of the internal elements of the device. The source of the first MIS transistor is connected to an input electrode. The drain of the first MIS transistor is connected to the gate of the second MIS transistor. The source region of the first MIS transistor comprises phosphoric atoms. The other diffusion regions comprise arsenic atoms. Therefore, the depth of the source region of the first MIS transistor is greater than the other diffusion region.

SUMMARY OF THE INVENTION

An object of the present invention is to provide means to reduce the spreading resistance of the source drain or polysilicon wire elements in high speed, high power LSI/VLSI circuits.

A further object of the present invention is to provide means including the combination of a buried contact diffusion and a source, drain and/or polysilicon wire for reducing resistance in chip circuits such as power drivers for dynamic latches.

The foregoing and other objects, features and advantages of the invention will be apparent from the following more particular description of the invention as illustrated in the accompanying drawings.

DESCRIPTION OF THE DRAWINGS

FIG. 1 is a schematic illustration of one embodiment of a class of circuits used in incorporating the present invention to reduce the spreading resistance of the source element in a power driver for dynamic latches.

FIG. 3 is a schematic illustration of an embodiment which extends the concept of FIG. 1 to include lowered resistance for the drain as well as the source.

DESCRIPTION OF THE INVENTION

Figures 2, 4:
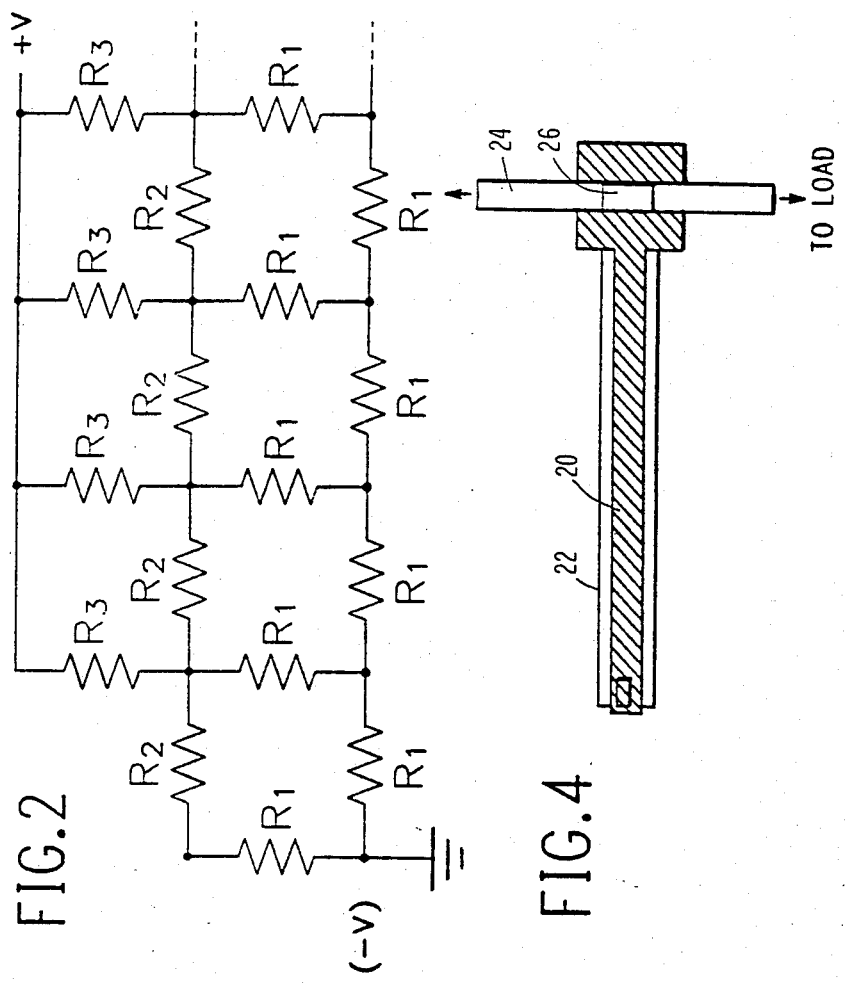
FIG. 2 is a schematic illustration of a lumped constant equivalent circuit of the structure of FIG. 1.
FIG. 4 is a schematic drawing which illustrates the use of the buried contact diffusion of the present invention in combination with polysilicon wire to reduce the resistance of the wire, and thus reduce the delay of a long wire or wire with a high capacitive load which has a significant polysilicon component at the source or driver end of the line.
Figure 5:
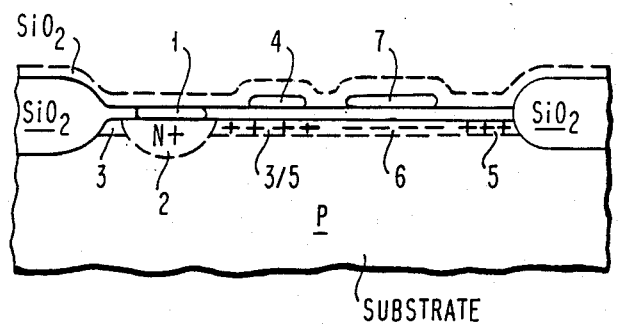
FIG. 5 is a schematic cross-sectional view of the structure of FIG. 1 taken through line 5 in FIG. 1.
Figure 6:
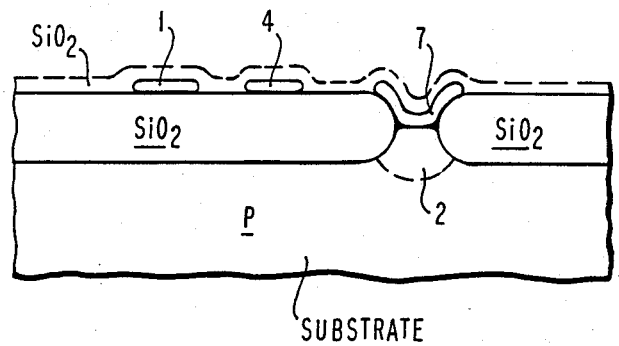
FIG. 6 is a schematic cross-sectional view of the structure of FIG. 1 taken through line 6 of FIG. 1.
Figure 7:
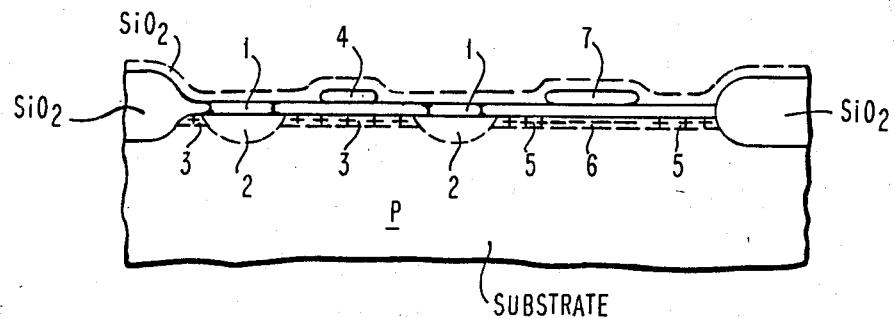
FIG. 7 is a schematic cross-sectional view of the structure of FIG. 3 taken through line 7 of FIG. 3.

Referring to FIG. 1, a schematic illustration is provided showing the use of a buried contact structure to decrease the spreading resistance of various elements of semiconductor devices such as transistors and diodes implemented in various technologies. In the described embodiment, "NMOS" technology is employed for purposes of explanation, however, the invention can be used with technologies such as "CMOS" as well. The invention is also useful as a means for reducing the resistance of polysilicon wires typically used in short lengths to connect circuit elements to other metallic wires in LSI and VLSI technologies.

In FIG. 1, the buried contact structure includes a phosphorous diffusion 2 with a resistance of approximately five ohms/square, superimposed on the field implant which includes the source 3, and drain 5 of the NMOS transistor or other device by means of an implantation of phosphorous into the field implant in the region of the source 3 or the drain 5, wherein the phosphorous implant obliterates the field implant in the area shown by reference numbers 2 in the drawings.

An overlayed layer 1 of polysilicon makes contact with the buried contact diffusion 2. The polysilicon layer 1 has a resistance of the order of 25 to 30 ohms/square in the present embodiment. The field implant used for the source 3 and drain 5 may, for example, be boron, which has a resistance of, typically, 15 to 20 ohms/square.

The circuit shown in FIG. 1 is a field effect (NMOS) transistor with a physical layout suitable for efficient stacking in a column of devices in the same general technology. In operation, the electron current flows from the source 3, which is connected to ground, or the negative voltage source, through a "channel" under the gate 4 to the drain 5. From there, the electron current flows through a depletion implant 6 under a "load" polysilicon gate 7 to a contact 10 and supply voltage bus 11. The current flow is controlled by the voltage applied to the control gate 4 which is polysilicon in the present embodiment.

The output from the transistor is taken from a buried contact 2 which makes a connection between the polysilicon load gate 7 and the drain area of the transistor 5. This is a conventional use of a buried contact.

The buried contact structure 2 provides a much lower resistance path for the current from the ground (or negative voltage) bus which is connected by suitable contacts to the field implant diffusion at source 3 in this physical layout. The following simplified model illustrates this feature.

A lumped constant equivalent circuit of the structure of FIG. 1 is shown in FIG. 2 and illustrates the means by which the resistance of the source to gate region is reduced by the novel use of a large buried contact structure.

Referring to FIG. 2, in the present embodiment, R1 would be 15 to 20 ohms (the resistance of a square of the field implant comprising the drain structure).

The value of resistance R2 is determined as follows:
R2=(buried contact resistance x polysilicon resistance)/(buried contact resistance+polysilicon resistance).

The present embodiment, $R2 \approx -(6 \times 30)/(6+30) \approx 5$ ohms $R3 \approx$ about 7 to 10 ohms resistance to the entrance of the channel under the gate 4.

If $R2 = (R1 \div 3)$, and $(R3 = 3/2\ R2)$, the resistance of the path to any part of the gate structure is (approximately, neglecting end effects)

$$n \times (((R2+R1) \times (2R1))/((R2+R1)+(2R1)))+(3R2)/2$$

(Where n is the length of the buried contact device in "squares".) Substituting 3R2 for R1 gives:

$$R \approx (1.8n \times R1)+3/2R1$$

Without the added buried contact structure, the resistance to a part of the gate structure would approximately be:

$$R \approx (3n \times R1)+3/2R1$$

Thus it can be seen that for long devices (large "n"), there is a marked reduction in the resistance of the source element.

Referring to FIG. 3, an embodiment of the invention is illustrated as applied to the reduction of the resistance of the drain element of a circuit in addition to the source element. Operation is the same as described hereinabove relative to the embodiment of FIG. 1 relating to the reduction of the resistance of source element.

FIG. 4 illustrates another embodiment of the invention applied to reducing the resistance of a polysilicon wire. In FIG. 4 is shown polysilicon wire 20, buried contact 22 diffused under the polysilicon wire 20, wire 24, and contact 26. Here a reduction of resistance is proportional to:

$$R2/R1$$

where R2 is the resistance of the buried contact 22 and R1 is the resistance of the polysilicon wire 20.

Here again it can be seen that the reduction in resistance is significant.

What has been described is a novel use of a buried contact structure to decrease the spreading resistance of various elements of semiconductor devices such as transistors and diodes implemented in various technologies such as "NMOS" and "CMOS". It is also useful and novel as a means for reducing the resistance of polysilicon wires typically used in short lengths to connect LSI and VLSI circuit elements to other metallic wires.

Having thus described my invention, what I claim as new, and desire to secure by Letters Patent is:

1. An integrated circuit semiconductor structure having reduced circuit spreading resistance values comprising a substrate of semiconductor material, that exhibits a given value of bulk resistance;

a first layer of doped conductive semiconductor material disposed on said substrate functioning to form a transistor device source element in a region therein having a given value of resistance;

a second layer of doped conductive semiconductor material disposed on said substrate functioning to form a transistor device drain element in a region therein having a given value of resistance;

a third layer of doped conductive semiconductor material disposed over said substrate to from a transistor device gate element having a given value of resistance;

a buried contact structure formed in a region of at least one of said first and second layers of doped conductive semiconductor material, said buried contact structure including a diffusion dopant material disposed in said at least one of said first and second layers of doped conductive semiconductor material proximate to said region of said one of said source and drain elements; and an overlayed layer of polysilicon material disposed on said buried contact structure region;

said buried contact structure region of dopant material diffused in said at least one of said first and second layers of doped conductive semiconductor material having a lower electrical resistance value in the order of three to four times less than the given resistance values of said first and second layers of doped conductive semiconductor material.

2. An integrated circuit semiconductor structure according to claim 1 wherein said buried contact structure region is disposed in said first layer of doped conductive semiconductor material proximate to said source element for providing a low resistance path for electron current flow from said source element to said drain element.

3. An integrated circuit semiconductor structure according to claim 1 wherein said buried contact structure region is disposed in both said first layer of doped conductive semiconductor material and in said second layer of doped conductive semiconductor material for providing low resistance paths for said first and second transistor source and drain elements.

4. An integrated circuit semiconductor structure according to claim 1 wherein said first and second transistor source and drain elements are composed of boron implanted in said first and second layers of doped conductive semiconductor material, said boron implanted semiconductor material providing a first resistance value, wherein said buried contact diffusion dopant material is phosphorous dopants providing a second resistance value less than the resistance value of said boron implanted semiconductor layers, such that said buried contact structure region provides a current path having a resistance less than said at least one of said first and second transistor source and drain elements.

5. An integrated circuit semiconductor structure according to claim 1 further including polysilicon wires having a resistance value disposed on said substrate for circuit interconnection, and a diffused buried contact structure region disposed under said polysilicon wire to reduce said resistance value of said polysilicon wire for circuit connections.

* * * * *